(12) United States Patent
Caplan

(10) Patent No.: US 7,567,133 B2
(45) Date of Patent: Jul. 28, 2009

(54) PHASE-LOCKED LOOP FILTER CAPACITANCE WITH A DRAG CURRENT

(75) Inventor: Randy Caplan, Hoschton, GA (US)

(73) Assignee: MOSAID Technologies Corporation, Sunnyvale, CA (US)

( * ) Notice: Subject to any disclaimer, the term of this patent is extended or adjusted under 35 U.S.C. 154(b) by 0 days.

(21) Appl. No.: 11/400,495

(22) Filed: Apr. 6, 2006

(65) Prior Publication Data

US 2007/0247236 A1    Oct. 25, 2007

(51) Int. Cl.
*H03L 7/00* (2006.01)
(52) U.S. Cl. .............................. 331/17; 331/16; 331/34
(58) Field of Classification Search .................... 331/16, 331/17, 34, 36 C; 327/156, 157
See application file for complete search history.

(56) References Cited

U.S. PATENT DOCUMENTS

| | | | |
|---|---|---|---|
| 3,969,678 A * | 7/1976 | Asahara et al. .............. 327/557 |
| 5,233,314 A | 8/1993 | McDermott et al. |
| 5,274,601 A | 12/1993 | Kawahara et al. |
| 5,362,990 A | 11/1994 | Alvarez et al. |
| 5,434,535 A * | 7/1995 | Tomasini et al. ............. 327/552 |
| 5,473,283 A | 12/1995 | Luich |
| 5,486,774 A | 1/1996 | Douseki et al. |
| 5,508,660 A | 4/1996 | Gersbach et al. |
| 5,973,552 A | 10/1999 | Allan |
| 6,046,627 A | 4/2000 | Itoh et al. |
| 6,124,755 A | 9/2000 | Parker et al. |
| 6,160,432 A | 12/2000 | Rhee et al. |
| 6,278,332 B1 | 8/2001 | Nelson et al. |
| 6,316,987 B1 | 11/2001 | Dally et al. |
| 6,329,874 B1 | 12/2001 | Ye et al. |
| 6,512,404 B2 | 1/2003 | Ruegg et al. |
| 6,535,051 B2 | 3/2003 | Kim |
| 6,603,340 B2 | 8/2003 | Tachimori |
| 6,617,936 B2 | 9/2003 | Dally et al. |
| 6,631,502 B2 | 10/2003 | Buffet et al. |
| 6,636,098 B1 | 10/2003 | Kizer |
| 6,664,829 B1 | 12/2003 | Hughes |

(Continued)

FOREIGN PATENT DOCUMENTS

EP    0405523 A2    1/1991

(Continued)

OTHER PUBLICATIONS

Jack Ou & M.F. Caggiano, Loop Filter Design Considerations for Clock and Data Recovery Circuits, 2003, IEEE, 0-7803-7778-8/03, p. 84.*

(Continued)

*Primary Examiner*—Robert Pascal
*Assistant Examiner*—Gerald Stevens
(74) *Attorney, Agent, or Firm*—Eaton Peabody Patent Group LLC; Dennis R. Haszko

(57) ABSTRACT

Phase-locked loop circuitry includes charge pump circuitry, loop filter circuitry, and drag current circuitry. The charge pump circuitry generates a charge pump current based on a phase of an input signal. The loop filter circuitry receives the charge pump current. The drag current circuitry generates a drag current to draw charge in the opposite direction from the charging current from a loop filter integration capacitor in the loop filter circuitry that does not include voltage sensing circuitry.

2 Claims, 9 Drawing Sheets

U.S. PATENT DOCUMENTS

| | | | |
|---|---|---|---|
| 6,667,641 B1 | 12/2003 | Wang et al. | |
| 6,710,665 B2 | 3/2004 | Maneatis | |
| 6,741,110 B2 | 5/2004 | Roisen | |
| 6,744,292 B2 | 6/2004 | Chen et al. | |
| 6,771,114 B2 | 8/2004 | Watarai | |
| 6,838,901 B2 | 1/2005 | Sakata et al. | |
| 6,853,253 B2 | 2/2005 | Desortiaux | |
| 6,861,916 B2 | 3/2005 | Dally et al. | |
| 6,924,992 B2 | 8/2005 | Gaudin et al. | |
| 6,954,511 B2 | 10/2005 | Tachimori | |
| 7,092,689 B1 | 8/2006 | Boecker et al. | |
| 7,176,733 B2 | 2/2007 | Haerle | |
| 7,339,420 B2 * | 3/2008 | Maeda | 327/554 |
| 7,429,854 B2 * | 9/2008 | Kimura | 323/315 |
| 2002/0041196 A1 | 4/2002 | Demone et al. | |
| 2002/0149429 A1 * | 10/2002 | Sander | 331/17 |
| 2003/0189991 A1 * | 10/2003 | Puccio et al. | 375/326 |
| 2004/0057546 A1 | 3/2004 | Badets et al. | |
| 2004/0066220 A1 | 4/2004 | Chen | |
| 2004/0085106 A1 | 5/2004 | Jeong | |
| 2005/0068076 A1 | 3/2005 | Iroaga | |
| 2005/0195003 A1 | 9/2005 | Soe | |
| 2005/0237120 A1 * | 10/2005 | Park | 331/16 |
| 2006/0017476 A1 * | 1/2006 | Jung et al. | 327/156 |
| 2006/0022727 A1 | 2/2006 | Kim | |
| 2006/0119404 A1 * | 6/2006 | Yeh | 327/157 |
| 2007/0018701 A1 | 1/2007 | Abbasi et al. | |
| 2007/0090882 A1 * | 4/2007 | Guenais | 331/16 |

FOREIGN PATENT DOCUMENTS

| | | |
|---|---|---|
| EP | 0484059 A2 | 5/1992 |
| EP | 0755120 A1 | 1/1997 |
| EP | 1292032 A1 | 3/2003 |

OTHER PUBLICATIONS

Jack Ou and M F Caggiano, Loop Filter Design Considerations for Clock and Data Recovery Circuits, 2003, IEEE, pp. 81 & 85.*

Duque-Carrillo, J.F. et al., "1-V Rail-to-Rail Operational Amplifiers in Standard CMOS Technology," Jan. 2000, IEEE Journal of Solid-State Circuits, vol. 35(1).

Maneatis, J. G., "Low-Jitter Process-Independent DLL and PLL Based on Self-Biased Techniques," Nov. 1996, IEEE Journal of Solid-State Circuits, vol. 31(11).

Kim, C.H. et al., "A 64-Mbit, 640-Mbyte/s Bidirectional Data Strobed, Double-Data-Rate SDRAM with a 40-mW DLL for a 256-Mbyte Memory System," Nov. 1998, IEEE Journal of Solid-State Circuits, vol. 33(11).

Moon, Y. et al., "An All-Analog Multiphase Delay-Locked Loop Using a Replica Delay Line for Wide-Range Operation and Low-Jitter Performance". Mar. 2000, IEEE Journal of Solid-State Circuits, vol. 35(3).

Larsson, P., "A2-1600MHz 1.2-2.5V CMOS Clock-Recovery PLL with Feedback Phase-Selection and Averaging Phase-Interpolation for Jitter Reduction," 1999, IEEE Journal of Solid-State Circuits Conference.

Samavati, et al., "A Fully-Integrated 5 GHz CMOS Wireless-LAN Receiver", IEEE International Solid-State Circuits Conference, 2001.

PCT/US07/08474, International Search Report and Written Opinion, 9 pages, Sep. 29, 2008.

Mutoh S., et al., "1-V Power Supply High-Speed Digital Circuit Technology with Multithreshold-Voltage CMOS," IEEE Journal of Solid-State Circuits, vol. 30, No. 8, Aug. 1995.

Inukai T., et al., "Boosted Gate MOS (BGMOS): Device/Circuit Cooperation Scheme to Achieve Leakage-Free Giga-Scale Integration," Custom Integrated Circuits Conference, 2000.CI.

Kawaguchi H., et al., "A CMOS Scheme for 0.5V Supply Voltage with Pico-Ampere Standby Current," Solid-State Circuits Conference 1998. Digest of Technical Papers. 45th ISSCC 1.

Nose K., et al., "VTH-Hopping Scheme to Reduce Subthreshold Leakage for Low-Power Processors," IEEE Journal of Solid-State Circuits, vol. 37, No. 3, Mar. 2002, pp. 413-415.

Halter J. and F. Najm, "A Gate-Level Leakage Power Reduction Method for Ultra-Low-Power CMOS Circuits," IEEE Customs Integrated Circuits Conference, 1997, pp. 475-478.

Kao J. and A. Chandrakasan, "Dual-Threshold Voltage Techniques for Low-Power Digital Circuits," IEEE Journal of Solid-state Circuits, vol. 35, No. 7, Jul. 2000, pp. 1009-1018.

Lackey D., et al., "Managing Power and Performance for System-on-Chip Designs using Voltage Islands," Computer Aided Design, 2002. ICCAD 2002.IEEE/ACM International Conference.

Calhoun B., "A Leakage Reduction Methodology for Dtistributed MTCMOS," IEEE Journal of Solid-state Circuits, vol. 39, No. 5, May 2004, pp. 818-826.

Mutoh S., et al., "1-V Power Supply High-Speed Digital Circuit Technology with Multithreshold-Voltage CMOS," IEEE Journal of Solid-State Circuits, vol. 30, No. 8, Aug. 1995.

Kawaguchi H., et al., "A Super Cut-Off CMOS (SCCMOS) Scheme for 0.5-V Supply Voltage with Picoampere Stand-By Current," IEEE Journal of Solid-State Circuits, vol. 35, No. 10, Oct. 2000.

Inukai T., et al., "Boosted Gate MOS (BGMOS): Device/Circuit Cooperating Scheme to Achieve Leakage-Free Giga-Scale Integration," Custom Integrated Circuits Conference, 2000.CI.

Kawaguchi H., et al., "A CMOS Scheme for 0.5V Supply Voltage with Pico-Ampere Standby Current," Solid-State Circuits Conference 1998. Digest of Technical Papers. 45th ISSCC 1.

Horiguchi M., et al., "Switched-Source-Impedance CMOS Circuit For Low Standby Subthreshold Current Giga-Scale LSI's," IEEE Journal of Solid-State Circuits, vol. 28, No. 11, No, Nov. 1993.

Nose K., et al., "VTH-Hopping Scheme to Reduce Subthreshold Leakage for Low-Power Processors," IEEE Journal of Solid-State Circuits, vol. 37, No. 3, Mar. 2002, pp. 413-415.

Halter J. and F. Najm, "A Gate-Level Leakage Power Reduction Method for Ultra-Low-Power CMOS Circuits," IEEE Customs Integrated Circuits Conference, 1997, pp. 475-478.

Zhang Z. and Z. Guo, "Active Leakage Control with Sleep Transistors and Body Bias," www.eecs.berkeley.edu/~zyzhang/ee241/final.pdf.

Kao J. and A. Chandrakasan, "Dual-Threshold Voltage Techniques for Low-Power Digital Circuits," IEEE Journal of Solid-state Circuits, vol. 35, No. 7, Jul. 2000, pp. 1009-1018.

Lackey D., et al., "Managing Power and Performance for System-on-Chip Designs using Voltage Islands," Computer Aided Design, 2002. ICCAD 2002.IEEE/ACM International Conference.

Das K. and R. Brown, Ultra Low-Leakage Power Strategies for Sub-1 V VLSI: Novel Circuit Styles and Design Methodologies for Partially Depleted Sil 2003.

Calhoun B., "A Leakage Reduction Methodology for Dtistributed MTCMOS," IEEE Journal of Solid-state Circuits, vol. 39, No. 5, May 2004, pp. 818-826.

US 6,642,753, 11/2003, Choi (withdrawn)

* cited by examiner

US 7,567,133 B2

PHASE-LOCKED LOOP FILTER CAPACITANCE WITH A DRAG CURRENT

BACKGROUND

1. Technical Field

The present invention relates generally to phase-locked loop circuitry and more particularly to phase-locked loop filter capacitance with a drag current.

2. Description of Related Art

Filter circuitry may contain capacitors to filter certain frequencies of a signal. Filter circuitry is used in numerous types of electronic circuits. One type of electronic circuit is a phase-locked loop. A phase-locked loop (PLL) is an electronic circuit with a voltage- or current-driven oscillator that is adjusted to match in phase (and thus lock on) the frequency of an input signal. In addition, PLLs are used to generate a signal, modulate or demodulate a signal, reconstitute a signal with less noise, and multiply or divide a frequency. Examples of applications for PLLs include frequency synthesizers for RF local oscillators or digital clock generation, recovery of small signals that otherwise would be lost in noise, lock-in amplifiers, and recovery of clock timing information from a data stream.

FIG. 1 illustrates phase-locked loop (PLL) circuitry 100 according to the prior art. Phase-frequency detector (PFD) circuitry 110 generates an "up" signal 115 and a "down" signal 120 by comparing the phase difference of an input signal 105 to a feedback signal 160. The PFD circuitry 110 outputs the up signal 115 and the down signal 120 depending on whether or not the phase of the feedback signal 160 lags (needs to speed up) or leads (needs to slow down) when compared to the input signal 105. Charge pump circuitry 125 generates current pulses in a charge pump output signal 130 (e.g., to charge capacitors in loop filter circuitry 135) based on the up signal 115 and the down signal 120. The current pulses generated by the charge pump circuitry 125 have a finite minimum pulse width in order to avoid a "dead-zone" effect. For example, when the input signal 105 and the feedback signal 160 have equal phase, the current pulses of the charge pump output signal 130 have a non-zero equal width. With unequal phase, one of the current pulses of the charge pump output signal 130 is lengthened to correct the phase.

The loop filter circuitry 135 low pass filters the charge pump output signal 130 and generates a filtered control signal 140. Voltage controlled oscillator (VCO) circuitry 145 generates an output signal 150 whose frequency is determined by the voltage of the filtered control signal 140. The PLL circuitry 100 loops the output signal 150 back to the PFD circuitry 110 as the feedback signal 160. Optionally, frequency divider circuitry 155 is placed in the feedback path of the loop to generate the feedback signal 160 and to allow the frequency of the output signal 150 to be a multiple of the input signal 105.

FIG. 2 illustrates loop filter circuitry 135 according to the prior art. The loop filter circuitry 135 depicted in FIG. 2 is an example of a second order loop filter. The loop filter circuitry 135 includes a capacitor 220, a resistor 230, and a capacitor 240. The charge pump circuitry 125 of FIG. 1 is represented in FIG. 2 as a current source 210. The capacitor 220 is connected to the control voltage node 215 and ground. The resistor 230 is connected to the control voltage node 215 and the capacitor 240. The capacitor 240 is also connected to ground. The control voltage node 215 is also connected to the voltage controlled oscillator circuitry 145 of FIG. 1. Due to stability concerns, the capacitor 240 (i.e. big capacitor) is usually at least ten times larger than the capacitor 220 (i.e. small capacitor). Increasing the size of the capacitor 240 with respect to the capacitor 220 improves phase margin, which is often desirable. However, it is also desirable to make the capacitor 220 (i.e., small capacitor) as large as possible to reduce the ripple on the control voltage. Therefore, in order to achieve good phase margin and ripple suppression, the capacitor 240 may need to be very large.

An important factor in PLL design is the loop bandwidth. The loop bandwidth describes characteristics of the PLL such as settling behavior and noise transfer functions. A very low loop bandwidth is desirable to achieve good filtering of reference clock noise and feedback divider noise. This is especially important in fractional-N PLL applications where the value of the feedback divide is constantly changing and large amounts of quantization noise may be introduced into the loop. Low bandwidth is also a requirement for loop stability when low reference clock frequencies are used. It is typically desirable for the loop bandwidth to be at least 10 times lower than that of the reference clock frequency. For fractional-N PLLs, the reference clock frequency to bandwidth ratios on the order of 100:1 may be used.

A PLL designer typically has two alternatives to achieve a lower loop bandwidth. First, the charge pump current can be decreased. However, decreasing the charge pump current increases its noise contribution and becomes increasingly difficult to implement at low levels.

The other alternative for lowering the loop bandwidth is increasing the size of the loop filter integration capacitor (i.e., big capacitor). Consequently, one limitation is the overall size of the PLL increases because of the increased size of the capacitor. In FIG. 2, the capacitor 220 is 17.5 pF, and the capacitor 240 is 280 pF. In this example, one problem is the big capacitor (i.e., the capacitor 240) at 280 pF occupies a significant area on the integrated circuit in order to achieve a low loop bandwidth. Some low bandwidth PLL designs may use off chip discrete components for the loop filter. However, components are increasingly being implemented on-chip to be fully integrated, which further increases the need to minimize area consumed on the integrated circuit.

SUMMARY OF THE INVENTION

The invention addresses the above problems by providing a phase-locked loop circuitry with drag current circuitry. The phase-locked loop circuitry includes charge pump circuitry, loop filter circuitry, and drag current circuitry. The charge pump circuitry generates a charge pump current based on a phase of an input signal. The loop filter circuitry receives the charge pump current. The drag current circuitry generates a drag current to draw charge in the opposite direction from the charging current from a loop filter integration capacitor in the loop filter circuitry that does not include voltage sensing circuitry.

The drag current may be a fraction of the charge pump current. The drag current may be delivered in discrete time. In some embodiments, the drag current circuitry is located within the charge pump circuitry. The drag current circuitry may comprise a current source and/or a resistor. The loop filter circuitry may comprise a first capacitor from a control voltage to ground, a resistor from the control voltage to an integration node, and the loop filter integration capacitor from the integration node to the ground and the drag current circuitry may be connected to the integration node.

A method for operating phase-locked loop circuitry includes the steps of generating a charge pump current in charge pump circuitry based on a phase of an input signal, receiving the charge pump current into loop filter circuitry, and generating a drag current in drag current circuitry to draw charge in the opposite direction from the charging current from a loop filter integration capacitor in the loop filter circuitry.

When implemented in a PLL, the drag current circuitry advantageously allows a designer to lower the loop bandwidth without lowering the charge pump current or increasing the capacitor area. Additionally, the charge pump current can be at a more easily managed signal current level rather than being lowered to an unmanageable level. Some embodiments implemented in a PLL have a significant improvement in power supply noise rejection. Some embodiments implemented in a PLL also have another advantage of a "fast locking" behavior.

DETAILED DESCRIPTION OF THE INVENTION

The embodiments discussed herein are illustrative of examples of the present invention. As these embodiments of the present invention are described with reference to illustrations, various modifications or adaptations of the methods and/or specific structures described may become apparent to those skilled in the art. All such modifications, adaptations, or variations that rely upon the teachings of the present invention, and through which these teachings have advanced the art, are considered to be within the scope of the present invention. Hence, these descriptions and drawings should not be considered in a limiting sense, as it is understood that the present invention is in no way limited to only the embodiments illustrated.

The embodiments discussed herein are described in the context of phase-locked loop circuitry. However, other embodiments of the invention may be implemented in any circuit that implements "an integration function", which can reduce the size of the integration capacitor. Since the integral of current (C) is charge (Q) and Q=CV, both Q and C can be reduced by the same amount and maintain the same voltage (V). Some examples of this circuitry is analog or switched capacitor filter circuitry. Some of this analog or switched capacitor filter circuitry may operate in discrete or continuous time and may be low pass filters.

Figure 3:
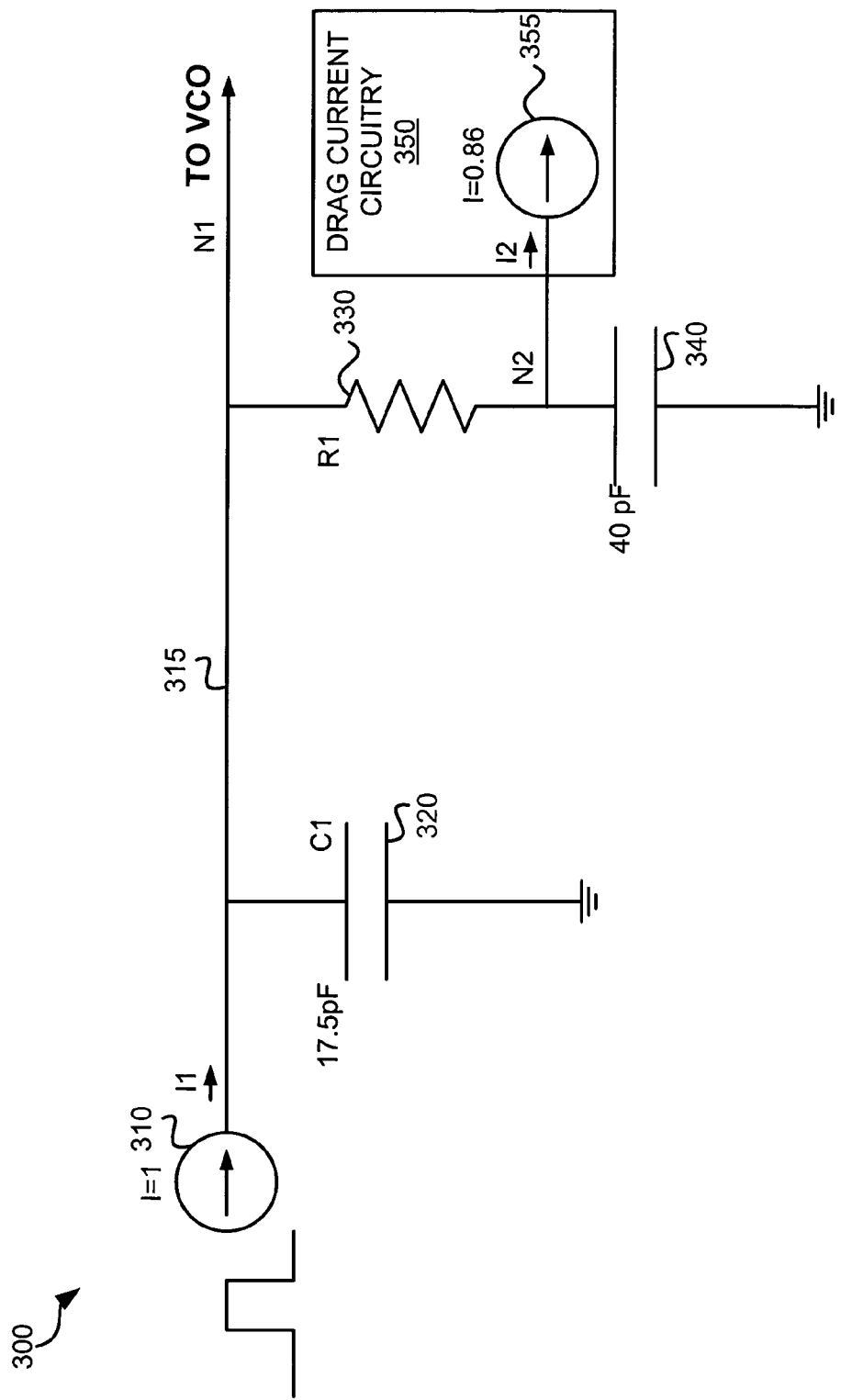
FIG. 3 is an illustration of loop filter circuitry in an embodiment of the invention.

FIG. 3 depicts an illustration of loop filter circuitry 300 in an embodiment of the invention. The loop filter circuitry 300 includes a capacitor 320, a resistor 330, and a capacitor 340.

Figure 1:
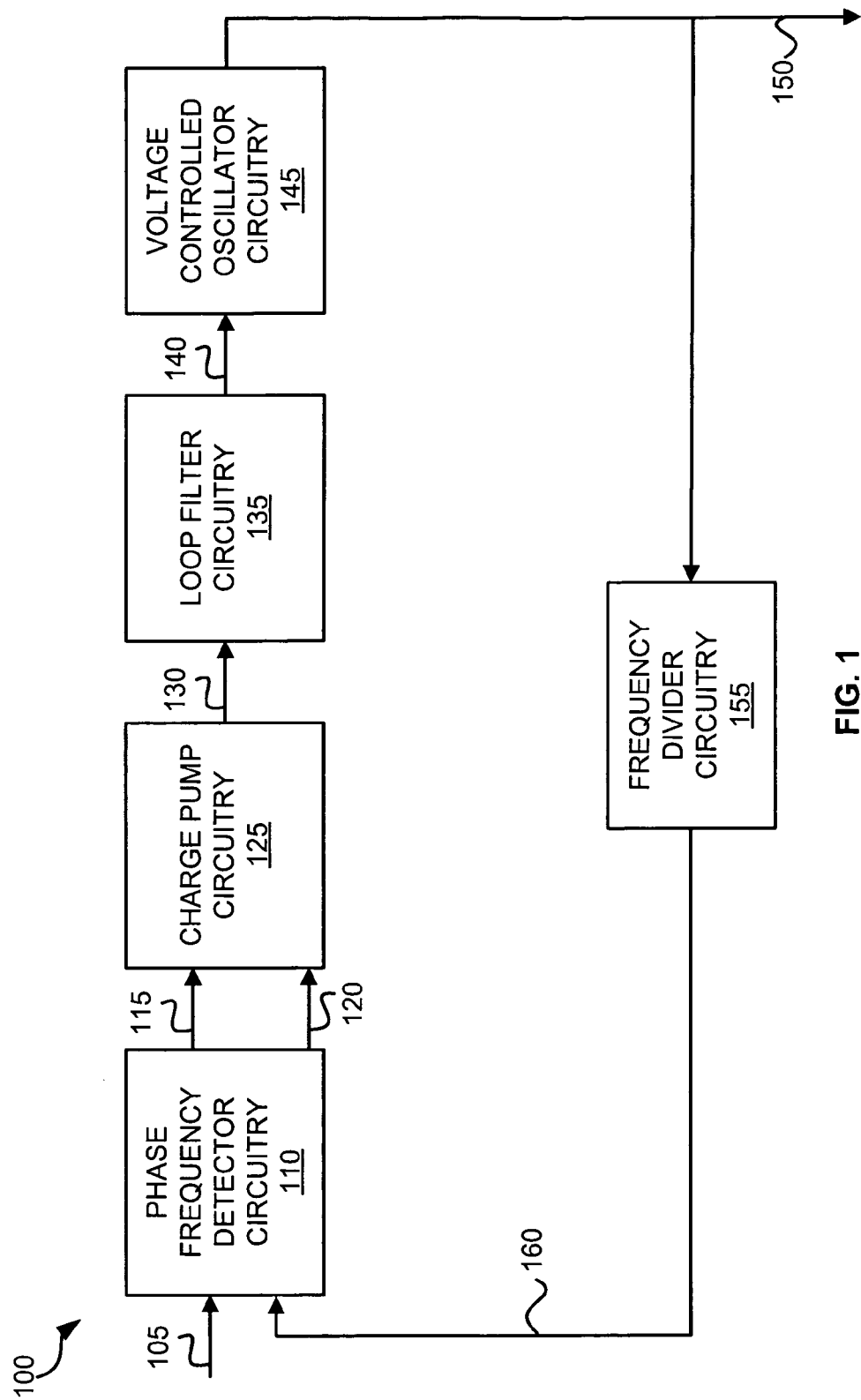
FIG. 1 is an illustration of phase-locked loop circuitry according to the prior art.

The current source 310 represents charge pump circuitry from PLL circuitry as depicted in FIG. 1. One example of charge pump circuitry is described in U.S. patent application Ser. No. 11/264,283, entitled "Phase-Locked Loop Circuitry Using Charge Pumps with Current Mirror Circuitry" filed on Oct. 31, 2005, which is hereby incorporated by reference.

The capacitor 320 is connected to the control voltage node 315 and ground. The resistor 330 is connected to the control voltage node 315, N1. The resistor 330 is connected to the capacitor 340 at a node called the integration node, N2. The capacitor 340 is also connected to ground. In this example, the capacitor 320 has a capacitance of 17.5 pF, and the capacitor 340 has a capacitance of 40 pF.

Drag current circuitry 350 is connected to the integration node, N2, between the resistor 330 and the capacitor 340. The drag current circuitry 350 is any electrical component, combination of electrical components, or circuitry configured to generate a drag current that directs charge in the opposite direction from the charging current from a capacitor in filter circuitry. A drag current is any flow of electricity that directs charge in the opposite direction of the charging current from a capacitor in filter circuitry. In FIG. 3, the drag current, I2, is a fraction of the charge pump current, I1. In FIG. 3, by removing/replacing an amount of charge from the integration node, N2, which is smaller yet proportional to the total charge delivered by the charge pump, the capacitor 340 appears larger by a factor of:

$$\frac{1}{\left(1-\left(\frac{I2}{I1}\right)\right)}$$

Figure 2:
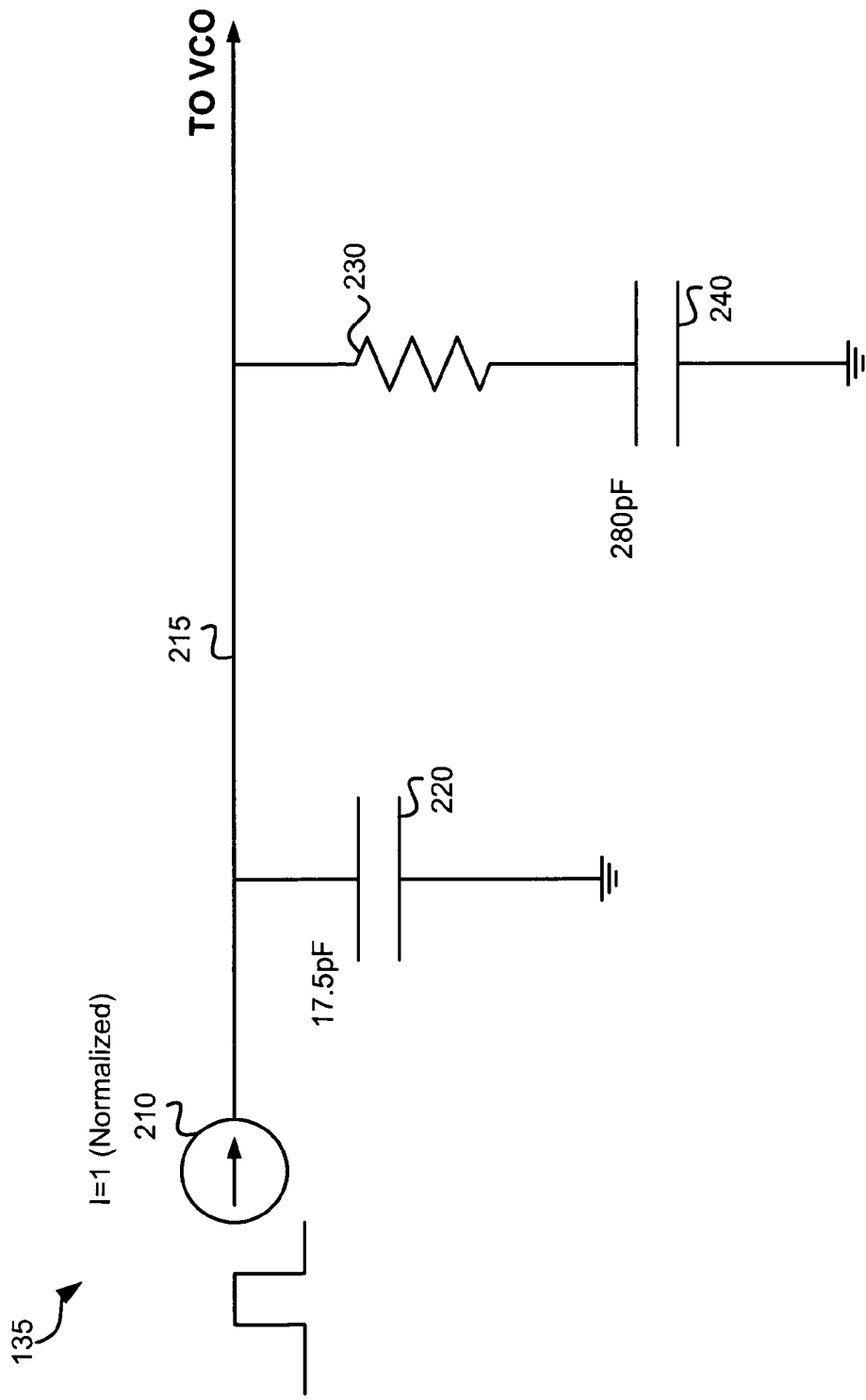
FIG. 2 is an illustration of loop filter circuitry according to the prior art.

For example, with a 90% charge removal, a PLL circuit sees a capacitor (i.e. capacitor 340), which is 10× larger than the actual capacitor needed to implement the big capacitance. Therefore, the capacitor (i.e. capacitor 340) appears to have a capacitance that is multiplied as compared to its actual capacitance. As a result, smaller capacitance can be used in the loop filter circuitry 300. For example, in FIG. 3, the capacitor 340 has a capacitance of 40 pF as compared with the capacitor 240 of FIG. 2, which has a capacitance of 280 pF. The overall size of the PLL circuitry will be reduced because the capacitance of the loop filter circuitry 300, specifically the capacitor 340, consumes less area on an integrated circuit.

In this example depicted in FIG. 3, the drag current circuitry 350 comprises a current source 355. In one embodiment, the current source 355 represents the charge pump circuitry of the PLL. In this embodiment, the charge pump circuitry has two outputs: one for charge pump current and the other for the drag current. In some embodiments, the drag current, I2, is a fraction and opposite polarity of the charge pump current, I1. The drag current may be generated using current mirrors in the charge pump circuitry, where the ratio of the transistor size in the current mirror is the same as the ratio of I2 to I1. One example of the charge pump circuitry that generates the charge pump current and the drag current is described below in FIG. 4.

The switches in the charge pump circuitry which enable the delivery of current I2 to node N2 can be enabled at the exact same time as the switches enabling the delivery of current I1 to node N1. Some embodiments of the charge pump circuitry may include feedback circuitry to ensure that the positive and negative currents are equal in magnitude such as within 1-2% across the allowed control voltage range. The drag current circuitry 350 delivers the drag current in discrete time or continuous time. In discrete time, the drag current circuitry 350 can remove the charge during the sampling period, which has benefits with regards to noise and accuracy.

The loop filter circuitry 300 of FIG. 3 does not perform current to voltage to current conversions unlike some prior art circuitries for multiplying capacitance. By not performing the current to voltage to current conversions, the loop filter circuitry 300 can be implemented in low power designs. Also, the loop filter circuitry 300 does not include voltage sensing circuitry such as an amplifier.

When implemented in a PLL, the drag current circuitry 350 advantageously allows a designer to lower the loop bandwidth without lowering the charge pump current or increasing the capacitor area. Additionally, the charge pump current can be at a more easily managed signal current level rather than being lowered to an unmanageable level.

Some embodiments implemented in a PLL have a significant improvement in power supply noise rejection. A prior art PLL typically rejects supply noise below its loop bandwidth and above the "short circuit" impedance of the small loop filter capacitor (i.e., ripple capacitor). However, in a prior art PLL, the ranges at low loop bandwidth will not overlap if the ripple capacitor is too small and a passband is created where supply noise can reach the output. In contrast, some embodiments have a loop filter short circuit impedance that is reduced below the loop bandwidth without a negative effect on stability. As a result, the entire frequency spectrum of supply noise is filtered out, and jitter is greatly reduced.

Some embodiments implemented in a PLL also have another advantage of a "fast locking" behavior. Prior art low bandwidth PLLs typically take a very long time to acquire phase lock. However, some embodiments reduce the drag current during the acquisition period which effectively increases the bandwidth at a cost of phase margin. In these embodiments, the loop remains stable enough to obtain phase lock at which the full drag current may be resumed to implement the low loop bandwidth.

There are numerous variations and configurations of electrical components such as resistors, capacitors, and current sources that can be used in the drag current circuitry 350 to generate a drag current that directs charge in the opposite direction from the charging current from a capacitor in filter circuitry.

Figure 4:
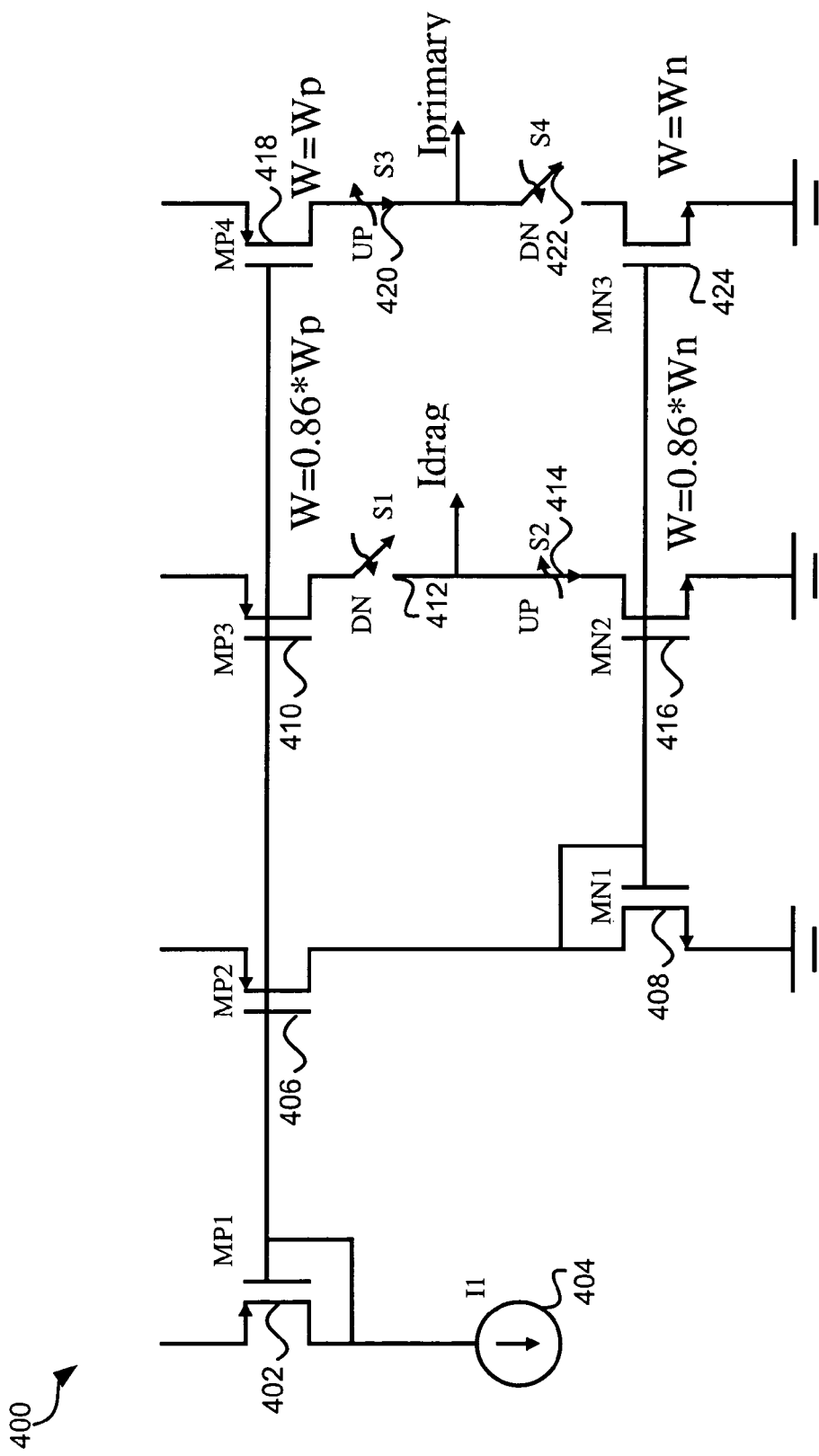
FIG. 4 is an illustration of charge pump circuitry in one embodiment of the invention.

FIG. 4 depicts an illustration of charge pump circuitry 400 in one embodiment of the invention. The charge pump circuitry 400 generates the primary current, $I_{primary}$, and the drag current, $I_{drag}$. The charge pump circuitry 400 includes a PMOS transistor (MP1) 402, a current source 404, a PMOS transistor (MP2) 406, an NMOS transistor (MN1) 408, a PMOS transistor (MP3) 410, a MOS switch (S1) 412, a MOS switch (S2) 414, an NMOS transistor (MN2) 416, a PMOS transistor (MP4) 418, a MOS switch (S3) 420, a MOS switch (S4) 422, and an NMOS transistor (MN3) 424.

The gate of the PMOS transistor (MP1) 402 is coupled to the drain of the PMOS transistor (MP1) 402 and the gate of the PMOS transistor (MP2) 406. The drain of the PMOS transistor (MP2) 406 is coupled to the drain and the gate of the NMOS transistor (MN1) 408. The source of the NMOS transistor (MN1) 408 is coupled to ground.

The gate of the PMOS transistor (MP2) 406 is coupled to the gate of the PMOS transistor (MP3) 410. The drain of the PMOS transistor (MP3) 410 is coupled to the MOS switch (S1) 412. The MOS switch (S1) 412 is coupled to the output for drag and the MOS switch (S2) 414. The MOS switch (S2) 414 is coupled to the drain of the NMOS transistor (MN2) 416. The gate of the NMOS transistor (MN2) 416 is coupled to the gate of the NMOS transistor (MN1) 408, and the source of the NMOS transistor (MN2) 416 is coupled to ground.

The gate of the PMOS transistor (MP3) 410 is coupled to the gate of the PMOS transistor (MP4) 418. The drain of the PMOS transistor (MP4) 418 is coupled to the MOS switch (S3) 420. The MOS switch (S3) 420 is coupled to the output for $I_{primary}$ and the MOS switch (S4) 422. The MOS switch (S4) 422 is coupled to the drain of the NMOS transistor (MN3) 424. The gate of the NMOS transistor (MN3) 424 is coupled to the gate of the NMOS transistor (MN2) 416, and the source of the NMOS transistor (MN3) 424 is coupled to ground.

The current, I1, from the current source 404 is an internally generated reference current. The PMOS transistor (MP1) 402 sets the PMOS gate bias voltage. The PMOS transistor (MP2) mirrors the current I1 down to the NMOS transistors 408, 416, and 424. The NMOS transistor (MN1) sets the NMOS gate bias voltage. The PMOS transistor (MP3) 410 and the NMOS transistor (MN2) 416 generate the drag current, $I_{drag}$. The PMOS transistor (MP4) 418 and the NMOS transistor (MN3) 424 generate the primary current, $I_{primary}$. The MOS switch (S1) 412 and the MOS switch (S4) 422 are closed when the primary current is pumping down. The MOS switch (S2) 414 and the MOS switch (S3) 420 are closed when the primary current is pumping up.

In this example in FIG. 4, the effective capacitance multiplication is 1/(1−0.86). The 0.86 value could be any value less than 1.

Figure 5:
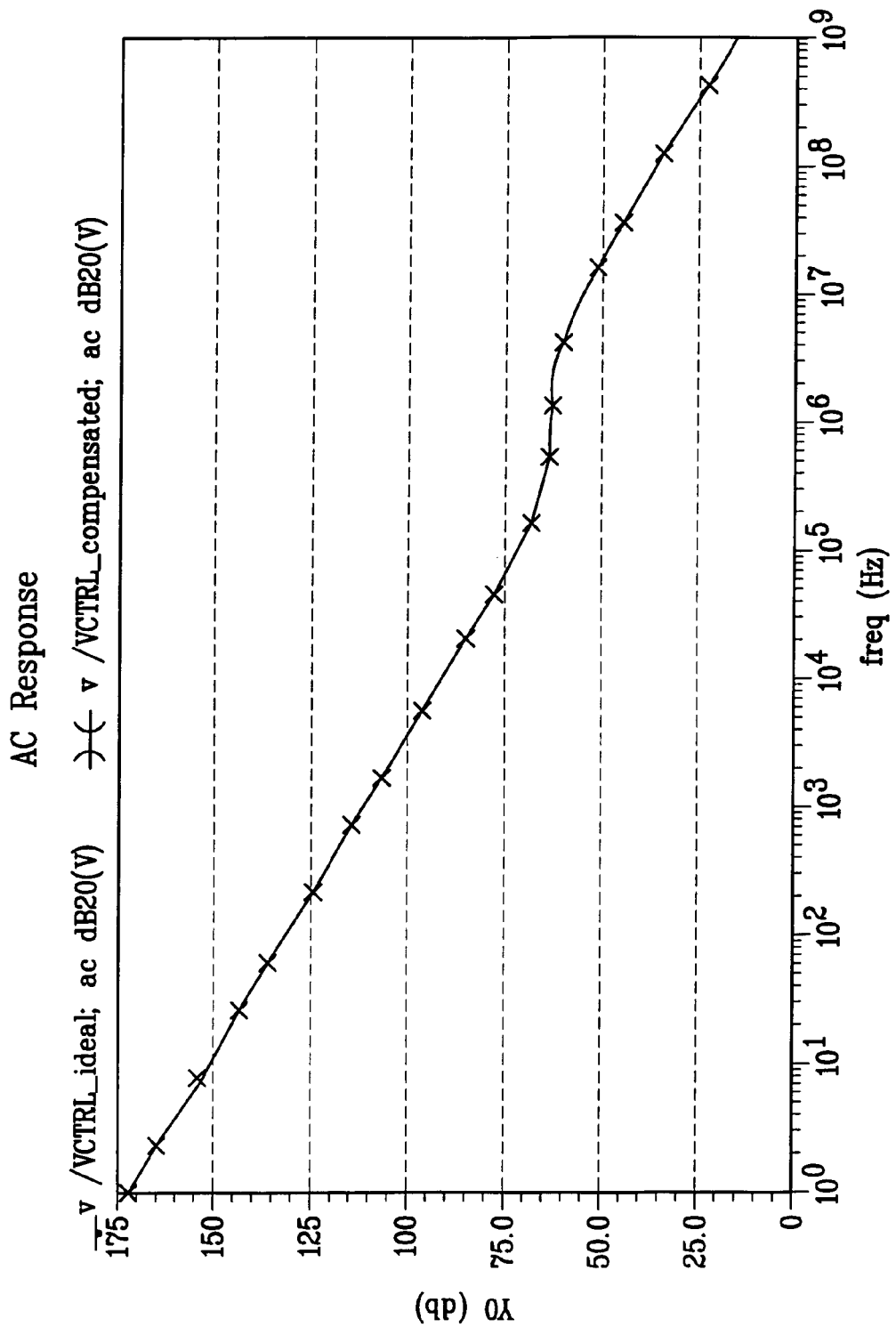
FIG. 5 is a graph of the AC transfer function (i.e., voltage vs. frequency) of a filter in the prior art and a filter in one embodiment of the invention.

FIG. 5 depicts a graph of the AC transfer function (i.e., voltage vs. frequency) of a filter in the prior art and a filter in one embodiment of the invention. FIG. 5 is from a SPICE level simulation of the loop filter circuitry 300 of FIG. 3 and an equivalent, ideal loop filter circuitry 135 of FIG. 2. FIG. 5 depicts an AC analysis comparing the loop filter circuitry 300 of FIG. 3 and the loop filter circuitry 135 of FIG. 2. As discussed above, the loop filter circuitry 300 of FIG. 3 comprises the capacitor 340 with a capacitance of 40 pF. The loop filter circuitry 135 of FIG. 2 comprises the capacitor 240 with a capacitance of 280 pF. Even though the capacitor 340 is less than the capacitor 240 by a factor of seven, FIG. 5 depicts that the zero and pole locations are placed identically.

Figure 6:
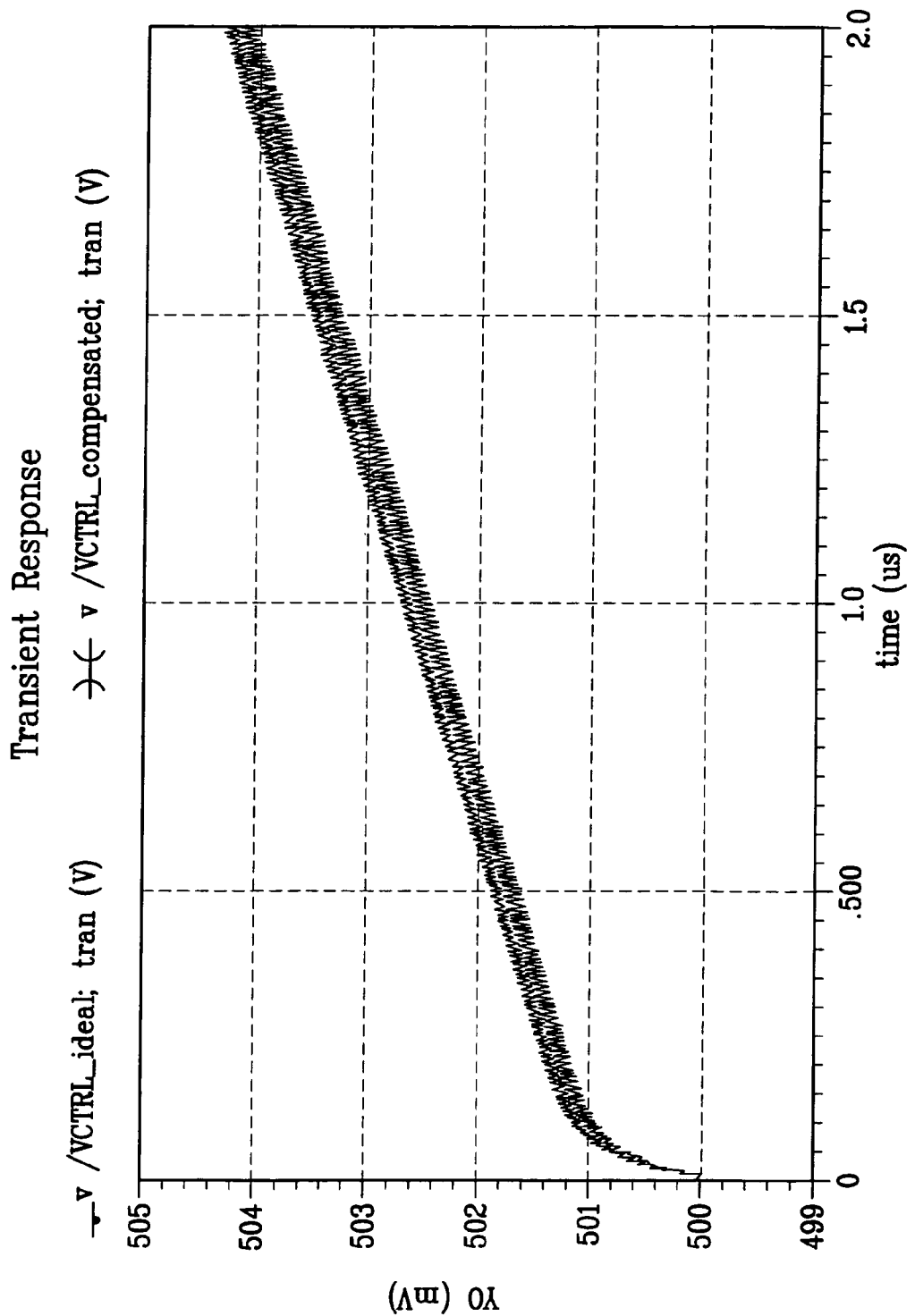
FIG. 6 is a graph of VCO control voltage vs. time for a filter in the prior art and a filter in one embodiment of the invention.

FIG. 6 depicts a graph of VCO control voltage vs. time for a filter in the prior art and a filter in one embodiment of the invention. FIG. 6 depicts a time domain analysis of the charge pump and loop filter combined. FIG. 6 depicts a comparison between the loop filter circuitry 300 of FIG. 3 and the loop filter circuitry 135 of FIG. 2. The slopes of the voltages for both filters are nearly identical as depicted in FIG. 6.

Figure 7:
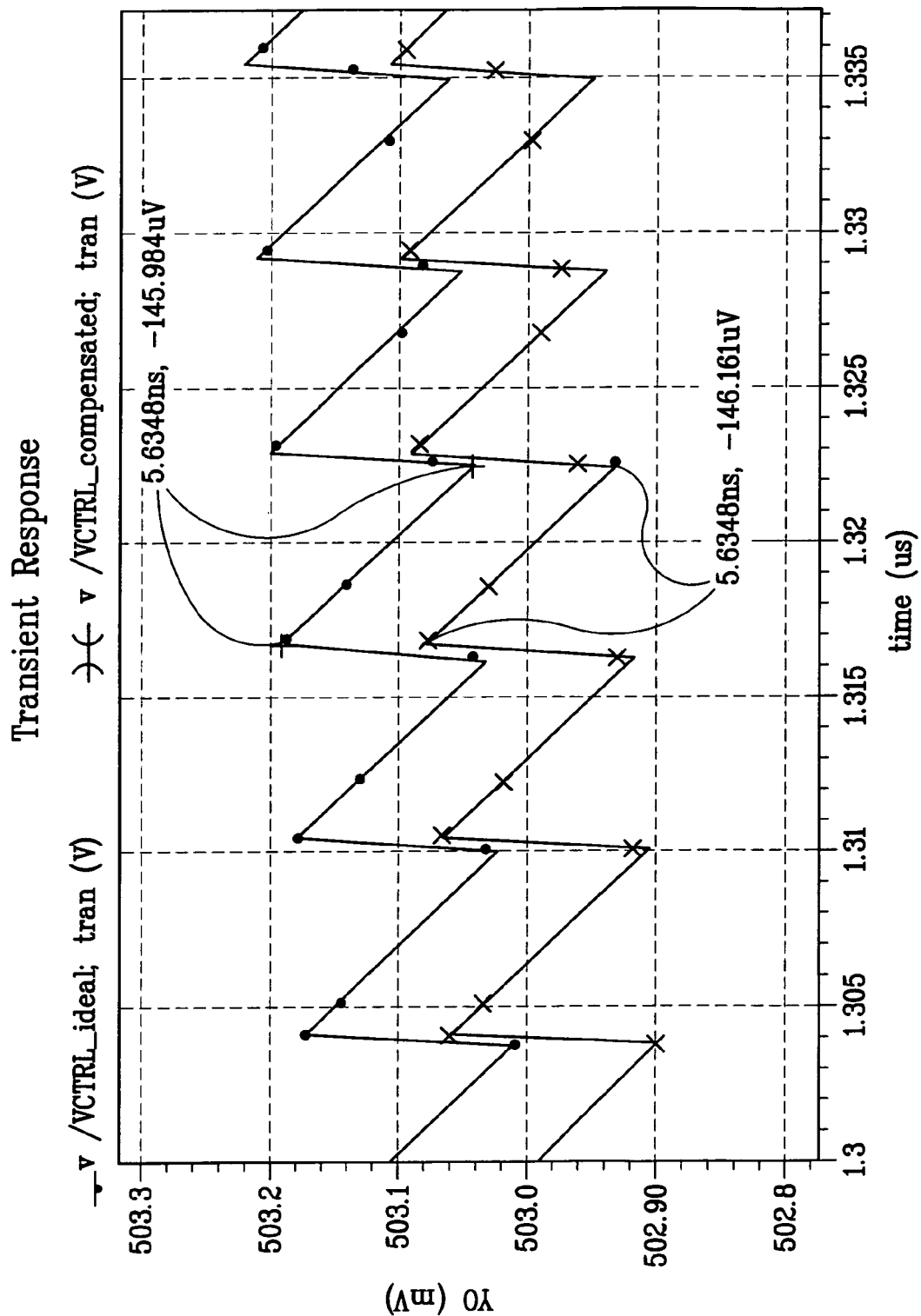
FIG. 7 is a zoomed-in graph of VCO control voltage vs. time for a filter in the prior art and a filter in one embodiment of the invention.

FIG. 7 depicts a zoomed-in graph of VCO control voltage vs. time for a filter in the prior art and a filter in one embodiment of the invention. FIG. 7 depicts a zoomed in view of FIG. 6. FIG. 7 shows that even though the drag current of the loop filter circuitry 300 of FIG. 3 is delivered in a discrete time fashion, the voltages track in continuous time and are essentially indistinguishable between the loop filter circuitry 300 of FIG. 3 and the loop filter circuitry 135 of FIG. 2.

Figure 8:
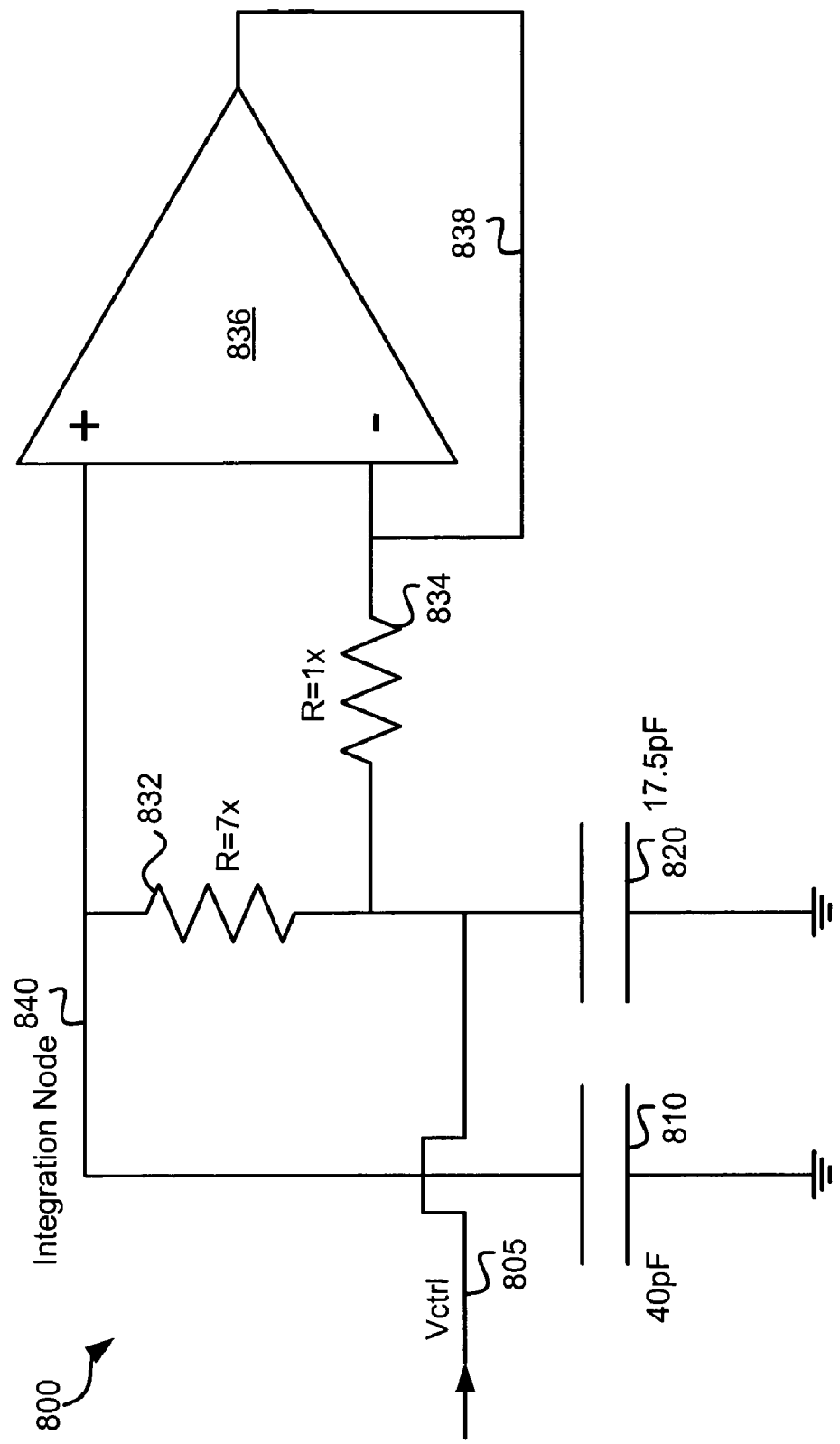
FIG. 8 is an illustration of loop filter circuitry in an embodiment of capacitance multiplication.
Figure 9:
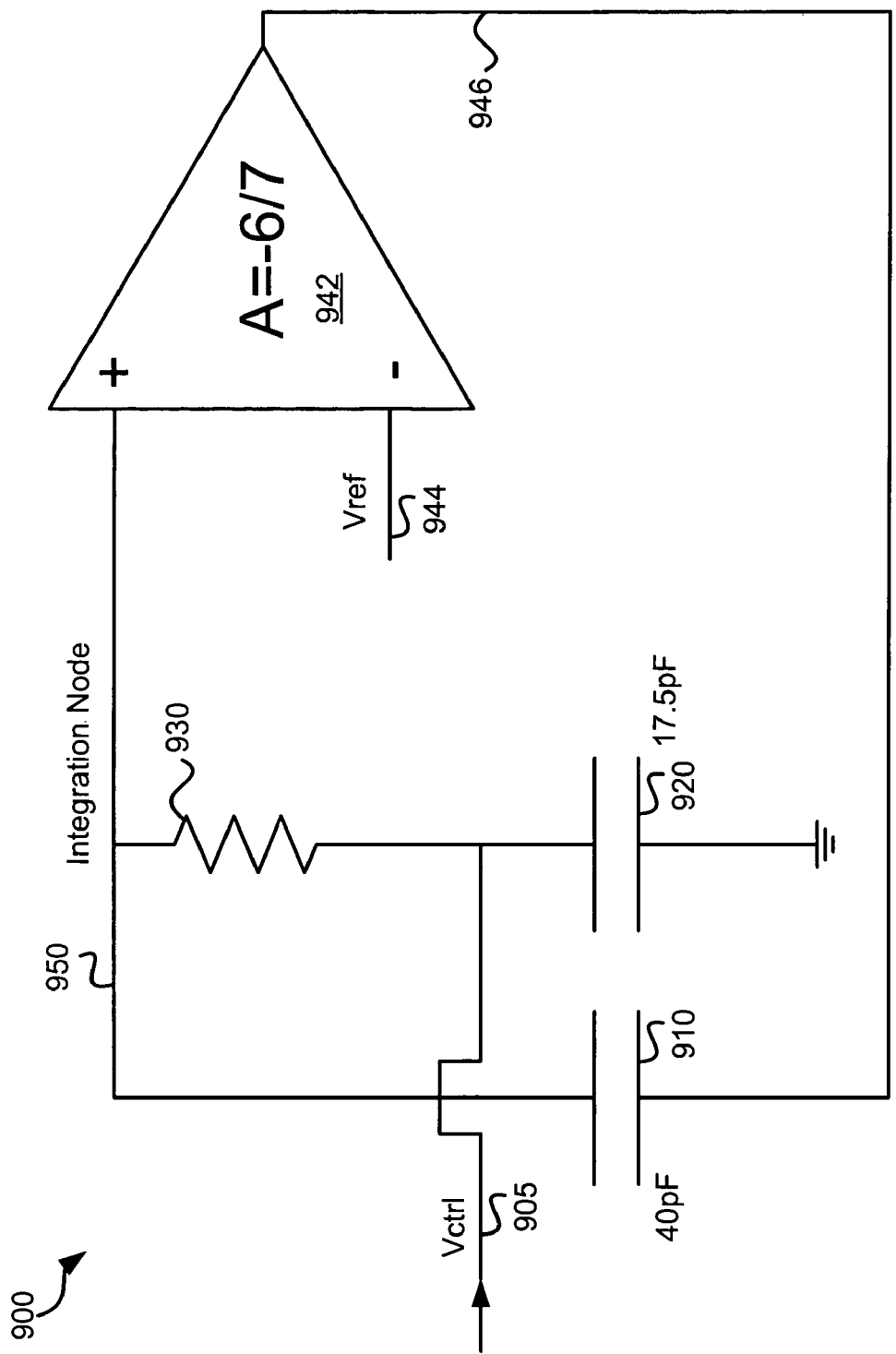
FIG. 9 is an illustration of loop filter circuitry in an embodiment of capacitance multiplication.

FIGS. 8-9 depict two other embodiments of capacitance multiplication. Unlike the loop filter circuitry 300 of FIG. 3, the embodiments shown in FIGS. 8-9 use an amplifier. FIG. 8 depicts an illustration of loop filter circuitry 800 in an embodiment of capacitance multiplication. The loop filter circuitry 800 includes a capacitor 810, a capacitor 820, a resistor 832, a resistor 834, and an operational amplifier 836. The capacitor 810 is connected to the integration node 840 and ground. The integration node 840 is connected to the positive terminal of the operational amplifier 836 and the resistor 832. The resistor 832 is also connected to the $V_{CTRL}$ input 805 and the resistor 834. The resistor 834 is connected to the negative terminal of the operational amplifier 836 and the feedback link 838. The feedback link 838 is also connected to the output of the operational amplifier 836. The capacitor 820 is connected to the resistor 832, the resistor 834, the $V_{CTRL}$ input 805, and ground.

In FIG. 8, the two resistors 832 and 834 with a fixed ratio (i.e. 7 to 1) and an operational amplifier 836 implement the drag current. In other embodiments, the fixed ratio may be arbitrarily high as long as there is sufficient accuracy in the drag current generation circuitry to ensure proper PLL functionality. The accuracy requirement increases in an exponential fashion making it fairly difficult to realize very large ratios. The 7× resistor 832 is connected to the capacitor 810 (i.e. "big cap"), and the 1× resistor 834 is connected to the negative terminal of the operational amplifier 836 connected as a voltage follower. The integration node 840 is connected to the positive terminal of the operational amplifier 836. Therefore, in this example, the operational amplifier 836 sinks ⅞ of the charge pump current, and the voltage change on the capacitor 810 (i.e. "big cap") is only ⅛ of that expected by the PLL.

FIG. 9 depicts an illustration of loop filter circuitry 900 in an embodiment of capacitance multiplication. The loop filter circuitry 900 includes a capacitor 910, a capacitor 920, a resistor 930, and a "Miller effect" amplifier 942. The capacitor 910 is connected to the integration node 950 and a feedback link 946. The capacitor 920 is connected to the $V_{CTRL}$ input 905, the resistor 930, and ground. The resistor 930 is connected to the integration node 950. The integration node 950 is connected to the positive terminal of the "Miller effect" amplifier 942. The $V_{REF}$ input 944 is connected to the negative terminal of the "Miller effect" amplifier 942. The output of the "Miller effect" amplifier 942 is connected to the feedback link 946.

In FIG. 9, the "Miller effect" amplifier 942 generates the drag current. The "Miller effect" amplifier 942 includes an inverting amplifier. The bottom terminal of the capacitor 910 (i.e. "big cap") is connected to the output of the amplifier 942 instead of ground. Therefore, if a 7× current is delivered to the loop filter circuitry 900, the amplifier 942 adjusts the bottom plate voltage of the capacitor 910 (i.e. "big cap"), so that only ⅐ of the voltage change is seen by the voltage controlled oscillator whose input is connected to the output of the loop filter circuitry 900 (Node 905, $V_{CTRL}$).

The active circuits of FIGS. 8 and 9 determine how much charge is being delivered to the integration node and then replace some portion of the charge so that the voltage change due to the charge pump current appears to be due to a larger capacitance. The drag current circuitry in FIGS. 8 and 9 operates in continuous time and may have negative effects on PLL performance such as increased jitter, increased power consumption, and inaccurate drag current generation across process corners and operating conditions.

The above description is illustrative and not restrictive. Many variations of the invention will become apparent to those of skill in the art upon review of this disclosure. The scope of the invention should, therefore, be determined not with reference to the above description, but instead should be determined with reference to the appended claims along with their full scope of equivalents.

What is claimed is:

1. Phase-locked loop circuitry comprising:
   charge pump circuitry configured to generate a pump current based on a phase of an input signal;
   loop filter circuitry configured to receive the charge pump current, the loop filter circuitry comprises a first capacitor connected between a control voltage and ground, a first resistor connected between the control voltage and an integration node, an operational amplifier having a positive terminal connected to the integration node, a second capacitor connected between the integration node and ground, a second resistor between the control voltage and a negative terminal of the operation amplifier, and a feedback link connecting an output of the operational amplifier to the negative terminal of the operational amplifier; and
   the first resistor, the second resistor, and the operational amplifier form drag current circuitry configured to generate a drag current to draw charge in the opposite direction from the charging current from the first capacitor.

2. The phase-locked loop circuitry of claim 1 wherein the first resistor and the second resistor are configured to have a fixed ratio.

* * * * *